United States Patent
Tsukamoto

[19]

[11] Patent Number: 6,040,224
[45] Date of Patent: Mar. 21, 2000

[54] METHOD OF MANUFACTURING SEMICONDUCTOR DEVICES

[75] Inventor: Hironori Tsukamoto, Kanagawa, Japan

[73] Assignee: Sony Corporation, Tokyo, Japan

[21] Appl. No.: 08/841,626

[22] Filed: Apr. 30, 1997

[30] Foreign Application Priority Data

Aug. 30, 1993 [JP] Japan .................................. 5-214232

[51] Int. Cl.⁷ .................................................. H01L 21/265
[52] U.S. Cl. ............................................ 438/308; 438/149
[58] Field of Search ............................ 438/308, 149, 438/163, 166, 197

[56] References Cited

U.S. PATENT DOCUMENTS

| | | |
|---|---|---|
| Re. 28,703 | 2/1976 | Te Velde et al. . |
| 4,431,459 | 2/1984 | Teng . |
| 4,432,133 | 2/1984 | Furuya . |
| 4,468,855 | 9/1984 | Sasaki . |
| 5,308,998 | 5/1994 | Yamazaki et al. . |
| 5,399,506 | 3/1995 | Tsukamoto . |
| 5,401,666 | 3/1995 | Tsukamoto . |
| 5,424,244 | 6/1995 | Zhang et al. . |
| 5,474,945 | 12/1995 | Yamazaki et al. . |

OTHER PUBLICATIONS

Japanese Abstract, JP6 77155, Mar. 18, 1994.

*Primary Examiner*—Chandra Chaudhari
*Assistant Examiner*—Martin Sulsky
*Attorney, Agent, or Firm*—Hill & Simpson

[57] ABSTRACT

A microscopic interconnection pattern and a gate electrode can be prevented from being deformed when a first region requiring high temperature heating, such as a source-drain region and a second region which should be prevented from being heated at high temperature, such as a microscopic interconnection pattern and a gate electrode are formed on the same semiconductor substrate. A first region which requires high temperature heating and a second region which should be avoided from being heated at high temperature are formed on a semiconductor substrate. In that case, the second region is composed of a narrow portion (1) and wide portions (2) wider than the narrow portion (1) formed on respective ends of the narrow portion 1. Then, the semiconductor substrate is photo-annealed.

11 Claims, 6 Drawing Sheets

METHOD OF MANUFACTURING SEMICONDUCTOR DEVICES

CROSS REFERENCE TO RELATED APPLICATION

A related application is Ser. No. 08/603,359, filed Feb. 20, 1996, which is a continuation of Ser. No. 08/296,421, filed Aug. 26, 1994, now abandoned.

BACKGROUND OF THE INVENTION

The present invention relates to a method of manufacturing a semiconductor device.

In a manufacturing process for manufacturing a variety of semiconductor devices, a plurality of semiconductor devices are fabricated on the same semiconductor substrate and the semiconductor devices thus formed are isolated from each other or interconnected with each other by a variety of high temperature heating processes.

Further, ions are implanted in order to form an LDD (lightly-doped drain) structure and a source-drain region of a semiconductor device. After ions were implanted, an annealing (referred to hereinafter as "activation annealing", if necessary) is required in order to recover a crystallinity of the semiconductor substrate or to electrically activate implanted acceptor ions and donor ions.

Furthermore, in order to reduce a contact resistance, a silicide layer that is a compound layer of silicon (Si) and a refractory metal (e.g., W, Mo, Ti, etc.) or metal, such as Pt and Pd should be heated at high temperature. As the activation annealing or high temperature heating, there are used a furnace annealing and a rapid thermal annealing (simply referred to as "RTA"), such as a lamp annealing or the like.

On the other hand, as the integration level of the semiconductor device is increased, individual semiconductors are reduced in size and therefore the source-drain region of the shallow junction is required. When the activation annealing is implemented according to the furnace annealing, a diffusion layer is increased in depth, which cannot meet with requirements such that the semiconductor device is made microscopic and increased in integration level by the shallow junction of the source-drain region.

When the activation annealing is implemented by the RTA, it can be expected that the resultant semiconductor device is made microscopic and is increased in integration level as compared with those achieved by the furnace annealing. However, there is the limit that the semiconductor device is made smaller and increased in integration level more than ever. To solve this problem, an activation annealing using a pulse laser radiation is proposed as one of the methods for forming a shallow junction.

Since pulse laser energy is absorbed by the extremely shallow portion (about 10 nm) of the surface of the semiconductor substrate, the extremely shallow portion of the surface of the semiconductor substrate is heated up to the melting point with the irradiation of the pulse laser and therefore the annealing of the depth of about 100 nm is made possible by heat conduction. Thus, the annealing using the pulse laser is suitable for the activation annealing used when the shallow LDD structure or the source-drain region of the shallow junction is formed.

However, when the source-drain region is formed by the activation annealing in the fabrication of the semiconductor device, electrode portions of a plurality of microscopic semiconductor devices were already formed on the same semiconductor substrate with the result that, upon laser annealing, the electrode portions of the microscopic semiconductor devices also are simultaneously radiated with laser beams and heated at high temperature.

It is customary that a gate electrode and an interconnection pattern are formed on an insulating film, such as an oxide film ($SiO_2$ film, etc.). Also, it is known that the insulating film have microscopic heat conductivity and is very resistant to transmittal of heat. Therefore, since the electrode portion that was heated at high temperature of about 1400 to 2000° C. with the radiation of laser beams is formed on the insulating film, the electrode portion is difficult to cool. There is then the problem that the microscopic gate electrode and interconnection pattern will be deformed by resultant heat.

To solve this problem, it is proposed that heat generated on the gate electrode and the interconnection pattern is suppressed by lowering the laser power. According to this method, an activation ratio of acceptor ions and donor ions in the LDD region is lowered and a resistance is increased so that the semiconductor device is lowered in operation speed. Moreover, since the heating temperature is low, a crystallinity of the semiconductor substrate is deteriorated and a leakage current is increased.

SUMMARY OF THE INVENTION

In view of the aforesaid aspect, it is an object of the present invention to provide a method of manufacturing a microscopic semiconductor device in which a shallow junction with low resistance is formed by high temperature heat treatment and in which microscopic electrode portions can be prevented from being deformed.

According to an aspect of the present invention, there is provided a method of manufacturing a semiconductor device which comprises the steps of forming a first region which requires high temperature heating on a semiconductor substrate, forming a second region which should be avoided from being heated at high temperature on the semiconductor region, the second region having a narrow portion and a wide portion integrally formed at least on one end of the narrow portion, and photo-annealing the semiconductor substrate on which the first and second regions are formed.

DETAILED DESCRIPTION OF THE PREFERRED EMBODIMENT

The present invention will now be described with reference to the drawings.

Laser radiation energy should preferably be increased in order to activate the impurity implanted into the semiconductor substrate by ion implantation. However, if the laser radiation energy were increased in excess of the required laser radiation energy, the depth of the junction would be increased. This should not be preferable for microscopic transistors.

Figure 1:
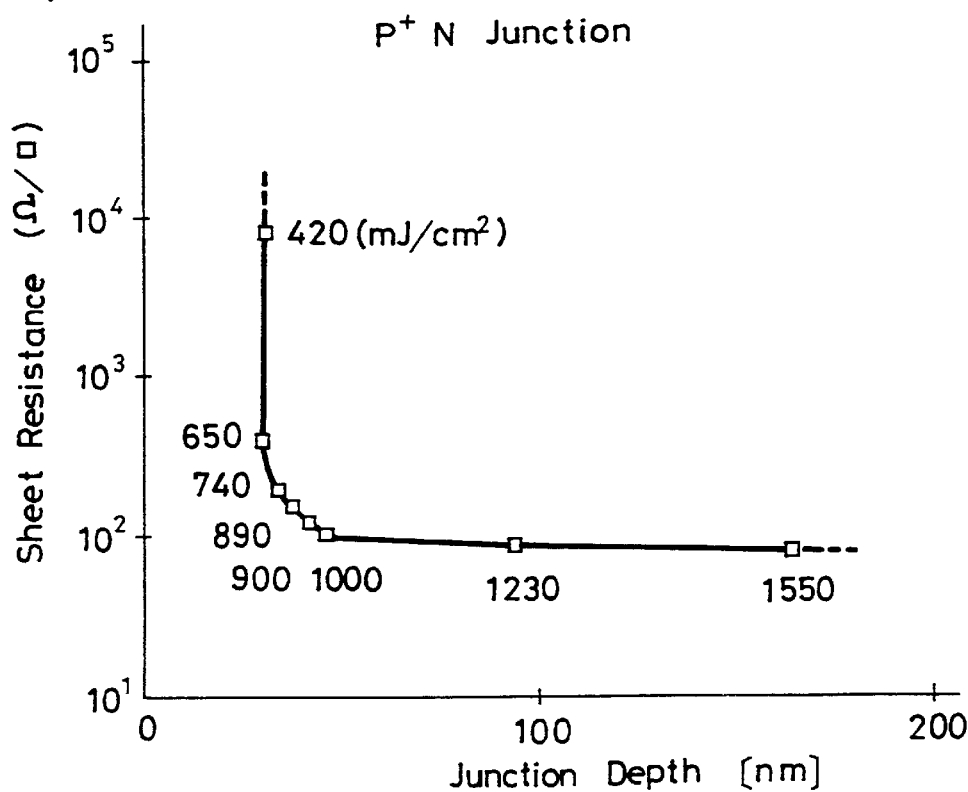
FIG. 1 is a graph showing a relationship between a sheet resistance and a junction depth of an impurity region obtained when a laser radiation energy is used as a parameter in the $p^+$ N junction.
Figure 2:
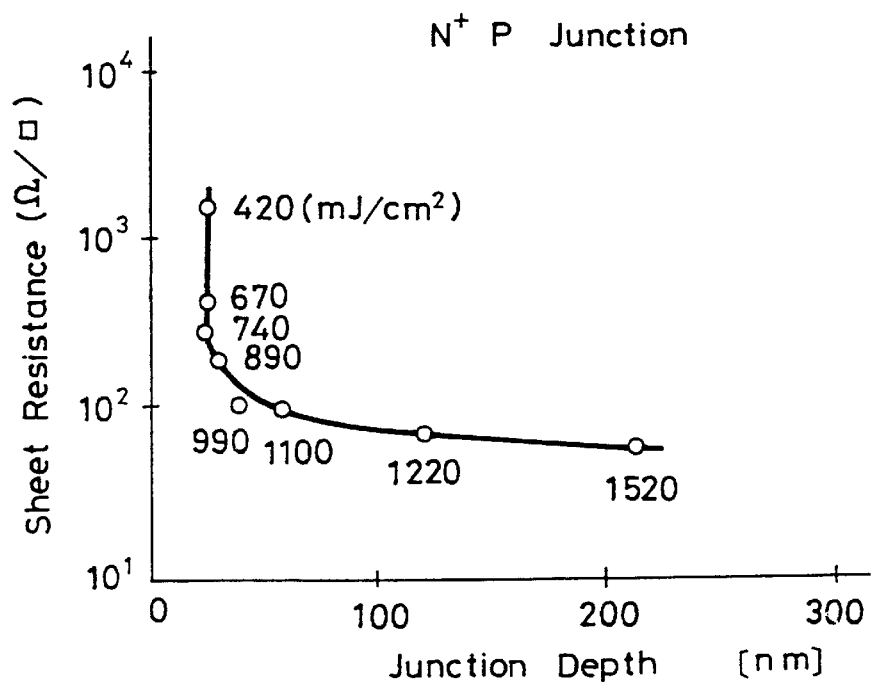
FIG. 2 is a graph showing a relationship between a sheet resistance and a junction depth of an impurity region obtained when a laser radiation energy is used as a parameter in the $N^+$ P junction.

FIGS. 1 and 2 of the accompanying drawings show a relationship between a sheet resistance and a depth of junction obtained when the impurity-doped semiconductor substrate is radiated with laser beams, respectively.

FIG. 1 is a graph showing a relationship between a depth of $P^+N$ junction and a sheet resistance obtained when a radiation energy (mJ/cm$^2$) was used as a parameter.

As a sample, ions of $BF_2^+$ were implanted on an N-type silicon substrate at 15 KeV by $3\times10^{15}$/cm$^2$ (dose). Then, an $SiO_2$ film with a film thickness of 50 nm was deposited on the surface of the semiconductor substrate as a reflection preventing film and radiated with laser beams emitted from an excimer laser.

FIG. 2 is a graph showing a relationship between a depth of $N^+P$ junction of a sheet resistance obtained when a radiation energy (mJ/cm$^2$) was used as a parameter.

As a sample, ions of $As^+$ were implanted on a P-type silicon substrate at 15 KeV by $3\times10^{15}$/cm$^2$ (dose). Then, an $SiO_2$ film with a film thickness of 50 nm was deposited on the surface of the semiconductor substrate as a reflection preventing film and radiated with laser beams emitted from the excimer laser.

Study of FIGS. 1 and 2 reveals that radiation energy of about 1100 mJ/cm$^2$ can be used in order to decrease the sheet resistance and to make the depth of the junction become lower than 0.1 μm. If however the radiation energy is increased in excess of 800 mj/cm$^2$, then the microscopic interconnection pattern and the microscopic gate electrode will be melted, contracted due to a surface tension and then as a result is deformed. In particular, this phenomenon occurs in the microscopic pattern in which the line width is 0.2 μm or smaller, and becomes remarkable in the microscopic pattern in which the line width is 0.1 μm or smaller.

Figure 3:
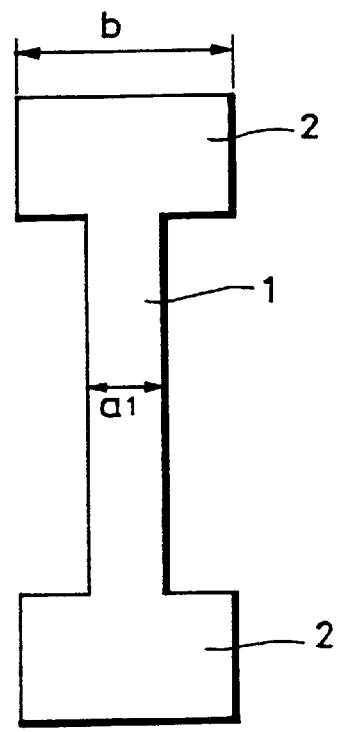
FIG. 3 is a plan view showing an example of a microscopic region such as an interconnection pattern and a gate electrode pattern according to the present invention.

According to this embodiment, as shown in FIG. 3, in the region that should be avoided from being heated, such as the microscopic interconnection pattern and the gate electrode in which the minimum line width is 0.2 μm or smaller, a wide portion 2 whose width b is wider than the minimum line width a1 by about 5% to 10% is formed at respective ends of the narrow line portion 1 which becomes a main structure thereof.

Figure 4:
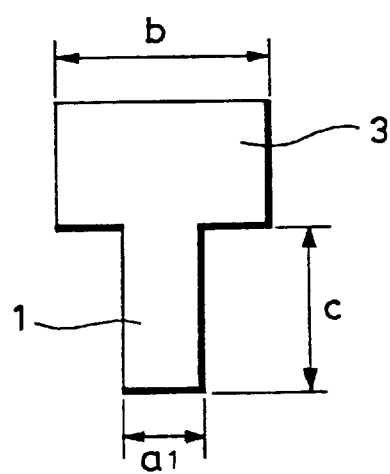
FIG. 4 is a plan view showing another example of a microscopic region such as an interconnection pattern and a gate electrode pattern according to the present invention.

Further, as shown in FIG. 4, in the region that should be avoided from being heated, such as the microscopic interconnection pattern and the gate electrode in which the minimum line width a1 is 0.2 μm or smaller, if a line length c of the narrow line portion 1 which serves as the main structure thereof falls within 10 μm, then a wide portion 3 whose width b becomes more than twice the line width a1 is integrally formed on one end of the narrow line portion 1.

According to the above-mentioned structure, even though the interconnection pattern and the gate electrode pattern are melted by heat generated when the ion-implanted other region is activation-annealed, the influence of the surface tension can be reduced by the wide portion 2 or 3 formed on respective ends or one end of the narrow line portion 1. Thus, it is possible to prevent the narrow line portion 1 from being deformed.

Therefore, when the semiconductor substrate in which the source-drain region which needs high temperature annealing at a temperature of about 1400 to 2000° C., the gate electrode and the interconnection pattern are formed together is activation annealed with the radiation of laser beams at radiation energy of about 800 to 1100 mJ/cm$^2$, a shallow junction with a depth of less than 0.1 μm can be obtained and the gate electrode and the interconnection pattern can be prevented from being deformed.

A specific example of a method of manufacturing a semiconductor device according to the present invention will be described below with reference to FIGS. 5A through 5E. FIGS. 5A through 5E are fragmentary cross-sectional views showing respective processes of the method of manufacturing a semiconductor device according to the present invention, respectively.

Figure 5A:
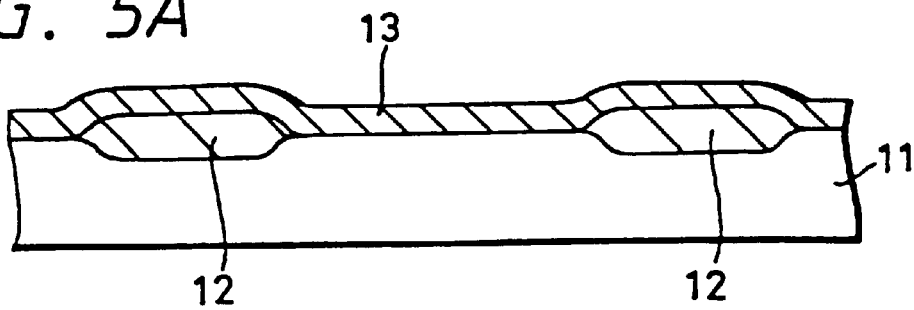
FIGS. 5A through 5E are respectively fragmentary cross-sectional views showing processes of a method of manufacturing a semiconductor device according to an embodiment of the present invention.
Figure 5B:
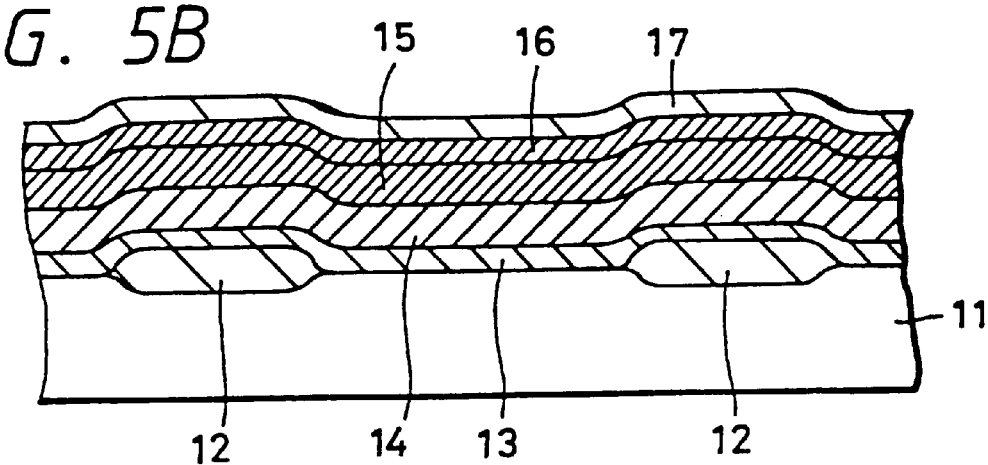

As shown in FIG. 5A, after an isolation region ($SiO_2$) 12 is formed on a first conductivity type silicon substrate 11 by local oxidation of silicon (LOCOS), a gate oxide film 13, a doped polysilicon film 14, a tungsten silicide film 15, a doped polysilicon film 16 and an oxide film ($SiO_2$) 17 are formed on the silicon substrate 11, in that order, as shown in FIG. 5B. The doped polysilicon film 16 is adapted to protect the tungsten silicide film 15 from the annealing which will be described later on.

Figure 5C:
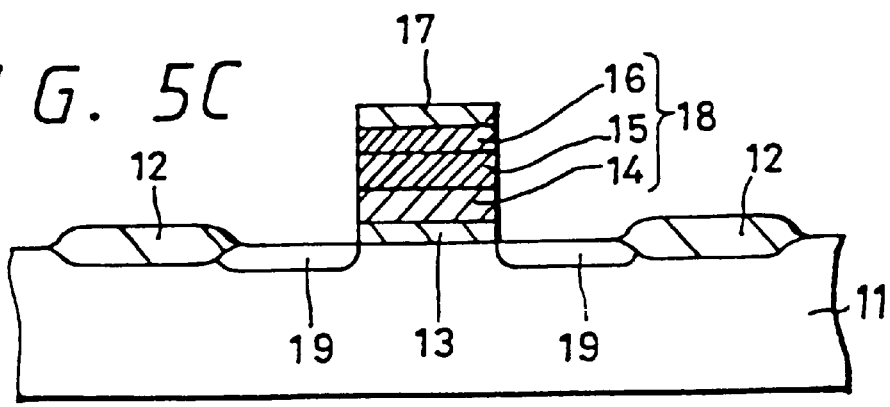

As shown in FIG. 5C, a gate electrode 18 is formed by patterning the laminated film of the gate oxide film 13 to the oxide film 17 by conventional lithography and dry etching. The pattern of the gate electrode 18 formed at that time is composed of the narrow line portion 1 with a line width a1 of 0.1 μm and wide portions 2 with a width b1 of 0.5 μm formed on the respective ends of the narrow line portion 1.

Subsequently, a second conductivity type lightly-doped source 19 is formed in a self-alignment with the mask of the isolation region 12 and the gate electrode 18 by implanting ions of second conductivity type impurity.

Figure 5D:
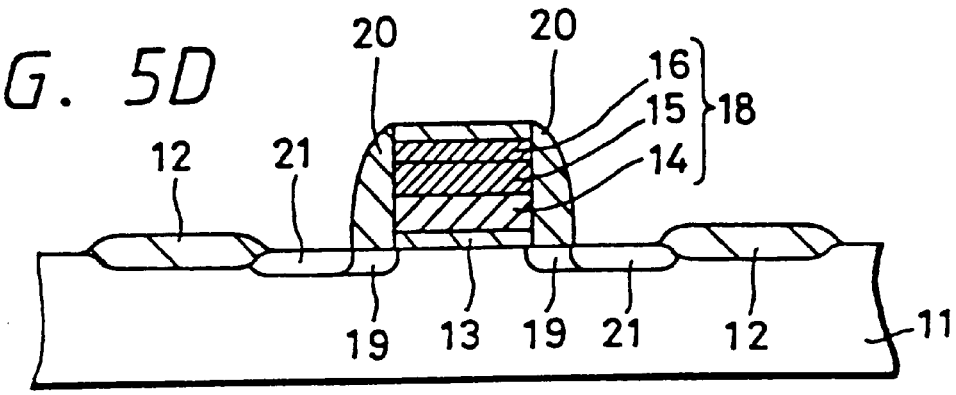

As shown in FIG. 5D, after an $SiO_2$ side spacer 20 is formed on the side wall of the gate electrode 18, ions are implanted into a second conductivity type source-drain region 21.

When ions of the second conductivity type impurity is $As^+$ ions, the implanting condition can be set to 5×20 KeV and the dose can be set to $1\times10^{15}$ to $3\times10^{15}$/cm$^2$. When ions of the second conductivity type impurity is $BF_2^+$ ions, the implanting condition can be set to 5 to 20 KeV and the dose can be set to $1\times10^{15}$ to $3\times10^{15}$/cm$^2$.

Figure 5E:
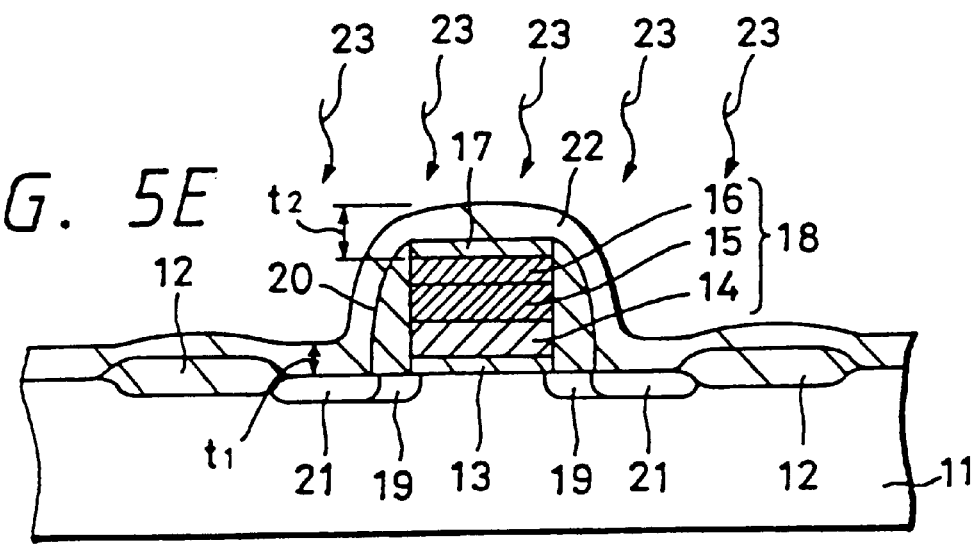
Figure 6:
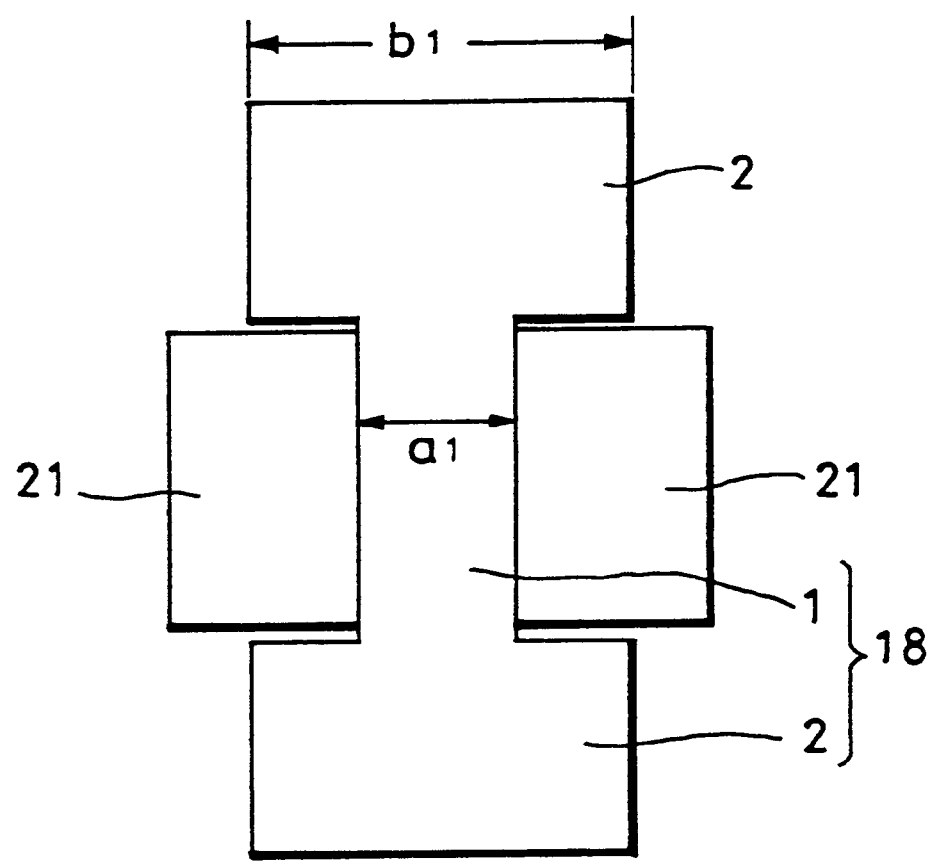
FIG. 6 is a plan view of a gate electrode pattern formed by the method of manufacturing a semiconductor device according to the embodiment of the present invention.
Figure 7:
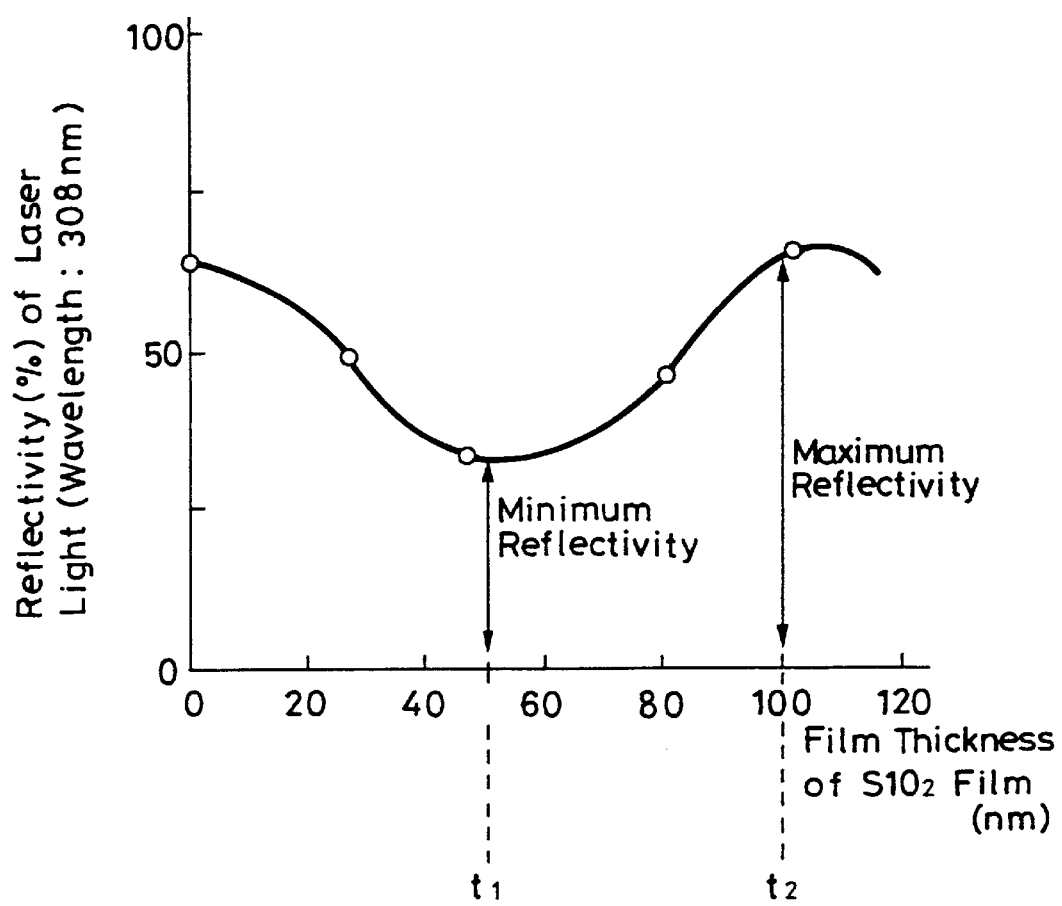
FIG. 7 is a graph showing a relationship between a film thickness of an $SiO_2$ film and a reflectivity of a laser light with a wavelength of 308 nm.

Then, there is formed an oxide film whose film thickness is selected so as to provide a minimum reflectivity for radiated light. According to this embodiment, as shown in FIG. 5E, an $SiO_2$ film 22 with a film thickness $t_1$ of 50 nm is formed on the whole surface. As a consequence, on the region that should be prevented from being heated, such as the interconnection pattern and the gate electrode are formed the $SiO_2$ films 17, 22 with a film thickness $t_2$ (=100 nm) in which a reflectivity for radiated light 23 becomes maximum (see FIG. 7: graph showing a relationship between the film thickness of the $SiO_2$ film and a reflectivity of laser light (wavelength is 308 nm)). The $SiO_2$ film 22 with the film thickness $t_1$ (=50 nm) in which the reflectivity for the radiated light 23 becomes minimum is formed on the source-drain region 21 that should be activation-annealed (see FIG. 7).

Then, the impurity is activated by radiating laser beams of an XeCl pulse laser (wavelength: 308 nm) at the energy of 800 mJ/cm$^2$.

The succeeding processes should be carried out in accordance with the conventional method of manufacturing a semiconductor device. Thus, a target semiconductor device can be obtained.

According to the above-mentioned method of manufacturing a semiconductor device of the present invention, the pattern of the gate electrode 18 and the interconnection pattern can be prevented from being deformed in the laser radiation process. In addition, it is possible to form the source-drain region 21 of the shallow junction of the depth of 0.1 $\mu$m or smaller. Thus, it becomes possible to manufacture microscopic transistors.

An activation ratio of acceptor ions and donor ions of the lightly-doped drain (LDD) region can be increased and a high operation speed can be obtained.

Further, since only the source-drain region 21 can be heated at high temperature, a crystallinity of the semiconductor substrate can be made satisfactory and a leakage current can be reduced.

Although the excimer laser, such as XeF laser (wavelength: 351 nm), XeCl laser (wavelength: 308 nm), KrF laser (wavelength: 249 nm) and ArF laser (wavelength: 193 nm) can be used for a pulse laser annealing, the KrF laser or XeCl laser which can stably generate a large laser output should be used preferably.

Furthermore, the annealing can be carried out by using a single wavelength light, such as a Canon lamp or the like instead of the laser radiation.

According to the method of manufacturing a semiconductor device of the present invention, in the photo-annealing process, the second microscopic region, such as the gate electrode pattern, the interconnection pattern or the like can be prevented from being deformed. Also, the first region which needs heating can be heated at high temperature. Therefore, it becomes possible to fabricate a microscopic semiconductor device whose integration level can be increased.

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. A method of manufacturing a semiconductor device having a microscopic region which is not damaged by laser-annealing, comprising the steps of:

forming a first region which requires heating on a semiconductor substrate at a first temperature;

forming a second region which should be protected from damage by not being heated to said first temperature on said first region, said second region having a first portion of a first width and a second portion having a width more than twice greater than that of said first portion, said second portion being integrally formed at least on one end of said first portion, wherein said width of said first portion is 0.2 $\mu$m or smaller and a length of said first portion is 10 $\mu$m or smaller; and ion implanting selectively to said semiconductor substrate; and laser-annealing said semiconductor substrate on which said first and second regions are formed, whereby the shape of said first and second portions protect said second region from damage during said annealing.

2. A method of manufacturing a semiconductor device according to claim 1, wherein said wide portion is formed on respective ends of said narrow portion.

3. A method of manufacturing a semiconductor device according to claim 1, wherein said semiconductor substrate and said second region have an insulating film formed therebetween.

4. A method of manufacturing a semiconductor device according to claim 1, wherein said first region is an impurity region formed within said semiconductor substrate by implanting ions.

5. A method of manufacturing a semiconductor device according to claim 4, wherein said laser-annealing is a process for activating ions in said impurity region.

6. A method of manufacturing a semiconductor device according to claim 5, wherein said first region is a source-drain region.

7. A method of manufacturing a semiconductor device according to claim 1, wherein said second region is a gate electrode.

8. A method of manufacturing a semiconductor device according to claim 1, wherein said second region is an interconnection layer.

9. A method of manufacturing a semiconductor device according to claim 1, wherein said laser-annealing is a pulse laser annealing.

10. A method of manufacturing a semiconductor device as claimed in claim 1, wherein said step of laser annealing is performed using a gas laser selected from the group consisting of: XeF laser, XeCl laser, KrF laser and ArF laser.

11. A method of manufacturing a semiconductor device as claimed in claim 1, wherein said step of laser-annealing is performed using an eximer laser.

* * * * *